United States Patent
Suh et al.

(10) Patent No.: US 7,476,892 B2
(45) Date of Patent: Jan. 13, 2009

(54) STORAGE NODE, PHASE CHANGE MEMORY DEVICE AND METHODS OF OPERATING AND FABRICATING THE SAME

(75) Inventors: Dong-Seok Suh, Yongin-si (KR); Tae-Sang Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 109 days.

(21) Appl. No.: 11/589,056

(22) Filed: Oct. 30, 2006

(65) Prior Publication Data
US 2007/0108488 A1 May 17, 2007

(30) Foreign Application Priority Data
Oct. 28, 2005 (KR) .................. 10-2005-0102499

(51) Int. Cl.
H01L 29/00 (2006.01)
H01L 29/02 (2006.01)
H01L 29/04 (2006.01)
H01L 47/00 (2006.01)
H01L 29/06 (2006.01)

(52) U.S. Cl. .................. 257/4; 257/2; 257/3; 257/5; 257/295

(58) Field of Classification Search ............. 257/2–5, 257/295
See application file for complete search history.

(56) References Cited

U.S. PATENT DOCUMENTS 7,151,300 B2 * 12/2006 Chang .................. 257/379
2006/0039192 A1 * 2/2006 Ha et al. .................. 365/163

* cited by examiner

Primary Examiner—Cuong Q Nguyen
Assistant Examiner—Trang Q Tran
(74) Attorney, Agent, or Firm—Harness, Dickey & Pierce, P.L.C.

(57) ABSTRACT

A storage node, a phase change memory device, and methods of operating and fabricating the same are provided. The storage node may include a lower electrode, a phase change layer on the lower electrode and an upper electrode on the phase change layer, and the lower electrode and the upper electrode may be composed of thermoelectric materials having a melting point higher than that of the phase change layer, and having different conductivity types. An upper surface of the lower electrode may have a recessed shape, and a lower electrode contact layer may be provided between the lower electrode and the phase change layer. A thickness of the phase change layer may be about 100 nm or less, and the lower electrode may be composed of an n-type thermoelectric material, and the upper electrode may be composed of a p-type thermoelectric material, or they may be composed on the contrary to the above. Seeback coefficients of the lower electrode, the phase change layer, and the upper electrode may be different from each other.

16 Claims, 12 Drawing Sheets

(a)

(b)

US 7,476,892 B2

STORAGE NODE, PHASE CHANGE MEMORY DEVICE AND METHODS OF OPERATING AND FABRICATING THE SAME

PRIORITY STATEMENT

This application claims priority under 35 USC § 119 to Korean Patent Application No. 10-2005-0102499, filed on Oct. 28, 2005, in the Korean Intellectual Property Office (KIPO), the entire contents of which are incorporated herein by reference.

BACKGROUND

1. Field

Example embodiments relate to a storage node, a semiconductor memory device and methods of operating and fabricating the same. Other example embodiments relate to a storage node, a phase change memory device and methods of operating and fabricating the same.

2. Description of the Related Art

A phase change random access memory (PRAM) may be one of non-volatile memory devices (e.g., a flash memory, a ferroelectric random access memory (FRAM) and/or a magnetic random access memory (MRAM)). A difference of a PRAM and other non-volatile memory devices may be a structure of a storage node. The storage node of a PRAM may include a phase change layer. A phase of the phase change layer may be changed from a crystal state to an amorphous state at a predetermined temperature, and from an amorphous state to a crystal state at a temperature lower than the predetermined temperature.

If a resistance of a phase change layer when a phase of the phase change layer is in an amorphous state is a first resistance, and a resistance of the phase change layer when a phase of the phase change layer is in a crystal state is a second resistance, the first resistance may be greater than the second resistance. A PRAM may be a memory device recording and reading bit data, using resistance characteristics of a phase change layer that a resistance of the phase change layer may be varied in accordance with a phase of the phase change layer as above.

FIG. 1 illustrates a conventional PRAM. Referring to FIG. 1, the conventional PRAM may include a transistor Tr, which may be composed of a source region S and a drain region D, and a gate G formed on a channel region C between the source and drain regions S and D, on a silicon substrate 7. The conventional PRAM may include a storage node 10 connected to either one of the two regions S and D of the transistor Tr, for example, the source region S. The storage node 10 may be connected to the source region S of the transistor Tr through a conductive plug 9. The storage node 10 may include a lower electrode 10a, a lower electrode contact layer 10b, a phase change layer 10c in which bit data may be recorded, and an upper electrode 10d, which may be sequentially stacked. The lower electrode 10a may also function as a pad layer providing a relatively wide area for the lower electrode contact layer 10b to be formed. The lower electrode contact layer 10b may contact a limited area below a bottom surface of the phase change layer 10c.

FIGS. 2(a)-2(c) illustrate a method of operating the conventional PRAM. In FIGS. 2(a)-2(c), the storage node 10 may be illustrated for convenience. Referring to FIGS. 2(a)-2(c), it may be considered that the conventional PRAM is in a set state and that bit data 0 may be recorded when a phase of the phase change layer 10c is in a crystal state. A first phase change current I1 may be applied from the upper electrode 10d through the phase change layer 10c to the lower electrode 10a in the state that bit data 0 is recorded. The first phase change current I1 may be a current changing a phase of the portion contacting the lower electrode contact layer 10b of the phase change layer 10c to an amorphous state, and may be called a reset current. The first phase change current I1 may be a pulse current, and may be applied for several nanoseconds, and may have a greater value than that of a set current.

The first phase change current I1 may be focused on the lower electrode contact layer 10b being narrower in width than the phase change layer 10c. As a resistance of a portion A1 (hereinafter, referred to as a contact area) of the phase change layer 10c contacting the lower electrode contact layer 10b is increased, a temperature of the contact area A1 may increase up to a phase change temperature or higher while the first phase change current I1 is applied. A phase of the contact area A1 of the phase change layer 10c may be changed from a crystal state to an amorphous state. As such, it may be considered that the conventional PRAM is in a reset state and that data 1 may be recorded when the contact area A1 of the phase change layer 10c is in an amorphous state. A reference numeral h1 in FIG. 2(a) indicates a height of the first phase change current I1.

As shown in FIG. 2(b), when the contact area A1 of the phase change layer 10c is in an amorphous state, a second phase change current I2 may be applied to the storage node 10 in the same direction as that of the first phase change current I1. As the second phase change current I2 changes the phase of the contact area A1 of the phase change layer 10c from the amorphous state to the original crystal state, it may be called a set current. The second phase change current I2 may be a pulse current. An intensity of the second phase change current I2 may be lower than that of the first phase change current I1. An applying time of the second phase change current I2 may be equal to or longer than that of the first phase change current I1.

While the second phase change current I2 is applied to the storage node 10 as in FIG. 2(c), a resistance of the contact area A1 of the phase change layer 10c may be increased, and a temperature of the contact area A1 may be increased. Because the intensity of the second phase change current I2 is relatively low and its applying time is relatively long unlike the case that the first phase change current I1 is applied, a temperature of the contact area A1 may not increase up to the phase change temperature of the phase change layer 10c. As such, because the contact area A1 is heated for a relatively long time at a temperature lower than the phase change temperature of the phase change layer 10c, the contact area A1 may change from an amorphous state to a crystal state so that the phase change layer 10c may be entirely in a crystal state.

As described above, the resistance state of the phase change layer 10c in the conventional PRAM may be determined by the first phase change current I1, for example, a reset current, and the second phase change current I2, for example, a set current. The first phase change current I1 may be a current to change a phase of the phase change layer 10c from a crystal state to an amorphous state, for example, current to generate a heat melting the phase change layer 10c. On the contrary, the second phase change current I2 may be a current to generate a heat for changing a phase of the phase change layer 10c, which is in an amorphous state by the first phase change current I1, from an amorphous state to a crystal state, and may be lower in current intensity than the first phase change current I1.

In the conventional PRAM as described above, the first and second phase change currents I1 and I2 may be applied to the storage node 10 through the transistor Tr. An intensity of the first phase change current I1 as a reset current, and an intensity of the second phase change current I2 as a set current may all be lower than an intensity of a current allowable for the transistor Tr. As described above, because the first phase change current I1 of the first and second phase change currents I1 and I2 may be higher, it may be necessary to reduce a reset current not to limit an integration density of a future PRAM. As ways of reducing the reset current of the conventional PRAM as described above, there have been proposed methods of reducing a width of the lower electrode contact layer 10b, a method of oxidizing the lower electrode contact layer 10b, and a method of employing a higher resistance TiAlN layer as the lower electrode contact layer 10b.

The methods may provide an effect of reducing the reset current because the lower electrode contact layer 10b may generate joule heat. Because the methods also increase the set resistance, a production yield and a reliability of the PRAM may be deteriorated.

SUMMARY

Example embodiments provide a storage node and a phase change memory device capable of reducing a reset current while preventing or reducing an increase of a set resistance. Example embodiments also provide a method of operating the phase change memory device. Other example embodiments also provide a method of fabricating the phase change memory device.

According to example embodiments, a storage node may include a lower electrode, a phase change layer on the lower electrode and an upper electrode on the phase change layer, wherein the lower electrode and the upper electrode are composed of thermoelectric materials having a melting point higher than that of the phase change layer, and having different conductivity types.

According to example embodiments, a phase change memory device may include a switching element and the storage node of example embodiments, wherein the lower electrode connected to the switching element. The switching element may be a transistor type or a diode type.

An upper surface of the lower electrode may have a recessed shape. A lower electrode contact layer may be provided between the lower electrode and the phase change layer. A thickness of the phase change layer may be about 100 nm or less. The lower electrode may be composed of an n-type thermoelectric material, and the upper electrode may be composed of a p-type thermoelectric material, or the upper electrode may be composed of an n-type thermoelectric material, and the lower electrode may be composed of a p-type thermoelectric material. Seeback coefficients of the lower electrode, the phase change layer, and the upper electrode may be different from each other.

The n-type thermoelectric material may be one selected from the group consisting of n-SiGe; $Sb_2Te_3$—$Bi_2Te_3$ (a $Sb_2Te_3$ content<a $Bi_2Te_3$ content); a material having GeTe as a main component; a material having SnTe as a main component; a material having PbTe as a main component; a material having TeAgGeSb as a main component. The materials may include a smaller amount of doping materials. The p-type thermoelectric material may be one selected from the group consisting of p-SiGe; $Sb_2Te_3$—$Bi_2Te_3$ (a $Sb_2Te_3$ content>a $Bi_2Te_3$ content); a material having GeTe as a main component; a material having SnTe as a main component; a material having PbTe as a main component; a material having TeAgGeSb as a main component. The materials may include a smaller amount of doping materials.

The n-type and p-type thermoelectric materials may be materials having a structure of binary skutterudite and an $MX_3$ composition (M=Co, Rh, or Ir; X=P, As, or Sb). The n-type and p-type thermoelectric materials may be materials having a structure of filled skutterudite and an $RT_4X_{12}$ composition (R=lanthanide element, actinide or alkaline-earth ion; T=Fe, Ru, Os, and X=P, As, or Sb). The n-type and p-type thermoelectric materials may be materials having a structure of clathrate and an $A_8B_{16}E_{30}$ composition with a little doping (A=alkaline earth metal; B=III group element (Ga, Al); E=Si, Ge, or Sn).

The lower electrode contact layer may be composed of a thermoelectric material having the same conductivity type as that of the lower electrode. When seeback coefficients of the lower electrode, the phase change layer, and the upper electrode are S1, S2 and S3 respectively, S1, S2 and S3 may satisfy one relation selected from the group consisting of a relation of S1<S2<S3, a relation of S1<S3<S2, and a relation of S2<S1<S3. In the relation of S1, S2 and S3, S1 and S3 may satisfy a relation of S3−S1>100 μV/K (K: absolute temperature).

According to example embodiments, a method of operating a phase change memory device may include maintaining a switching element in an on-state and applying a voltage between an upper electrode and a lower electrode such that current flows through a phase change layer, wherein the lower electrode and the upper electrode are composed of thermoelectric materials having a melting point higher than that of the phase change layer, and having different conductivity types.

The switching element may be a transistor type or a diode type. The current may be a reset current to form an amorphous region in the phase change layer, and the voltage may be a write voltage. The current may be a set current to change an amorphous region existing in the phase change layer to a crystal state, and the voltage may be an erase voltage. The material characteristics and geometrical characteristics of the lower electrode, the phase change layer, and the upper electrode, and additional elements may be the same as described in the memory device.

According to example embodiments, a method of fabricating a storage node may include forming a lower electrode layer covering a conductive plug on a first interlayer insulating layer, forming a second interlayer insulating layer covering the lower electrode layer on the first interlayer insulating layer, exposing the lower electrode layer in the second interlayer insulating layer by forming a via hole, filling the via hole with a layer, forming an upper electrode layer covering the layer and etching the upper electrode layer. The layer filling the via hole may be a phase change layer. The layer may be a lower electrode contact layer filling the via hole and a phase change layer formed on the second interlayer insulating layer, covering the lower electrode contact layer. Etching the upper electrode layer may further include etching the layer filling the via hole and the second interlayer insulating layer and the lower electrode layer.

According to example embodiments, a method of fabricating a phase change memory device may include forming a switching element on a substrate, forming the at least one interlayer insulating layer covering the switching element on the substrate, exposing the switching element in the at least one interlayer insulating layer by forming a contact hole, filling the contact hole with a conductive plug on the at least one interlayer insulating layer and forming the storage node according to example embodiments.

In the fabricating method, the switching element may be a transistor type or a diode type. The lower electrode layer and the upper electrode layer may be respectively composed of thermoelectric materials having different conductivity types from each other. The lower electrode layer, the phase change layer, and the upper electrode layer may be respectively formed of material layers having different seeback coefficients from each other. When seeback coefficients of the lower electrode layer, the phase change layer, and the upper electrode layer may be S1, S2 and S3 respectively, the lower electrode layer, the phase change layer, and the upper electrode layer may be respectively formed of material layers such that S1, S2 and S3 satisfy one relation of a relation of S1<S2<S3, a relation of S1<S3<S2, and a relation of S2<S1<S3. In the relation of S1, S2 and S3, S1 and S3 may satisfy a relation of S3−S1>100 μV/K (K: absolute temperature).

The lower electrode layer may be composed of an n-type thermoelectric material layer, and the upper electrode layer may be composed of a p-type thermoelectric material layer, or the upper electrode layer may be composed of an n-type thermoelectric material layer, and the lower electrode layer may be composed of a p-type thermoelectric material layer.

The filling of the via hole with the phase change layer may comprise forming a phase change material layer filling the via hole on the second interlayer insulating layer; and polishing an upper surface of the phase change material layer until the second interlayer insulating layer is exposed. After polishing, the method may further comprise lowering a height of an upper surface of the second interlayer insulating layer than that of an upper surface of the polished phase change material layer; and polishing the upper surface of the polished phase change material layer until the second interlayer insulating layer is exposed.

According to other example embodiments, there is provided a method of fabricating a phase change memory device comprising forming a switching element on a substrate; forming a first interlayer insulating layer covering the switching element on the substrate; forming a contact hole exposing the switching element in the first interlayer insulating layer; filling the contact hole with a conductive plug; forming a lower electrode covering the conductive plug on the first interlayer insulating layer; forming a second interlayer insulating layer covering the lower electrode on the first interlayer insulating layer; forming a via hole exposing the lower electrode in the second interlayer insulating layer; filling the via hole with a lower electrode contact layer; sequentially forming a phase change layer covering the lower electrode contact layer and an upper electrode layer on the second interlayer insulating layer; and sequentially etching the upper electrode layer and the phase change layer, in which the lower electrode contact layer and the upper electrode layer may be respectively composed of thermoelectric materials having different conductivity types from each other.

In the fabricating method, when seeback coefficients of the lower electrode contact layer, the phase change layer, and the upper electrode layer may be S1, S2 and S3 respectively, the lower electrode contact layer, the phase change layer, and the upper electrode layer may be respectively formed of material layers such that S1, S2 and S3 satisfy one relation of a relation of S1<S2<S3, a relation of S1<S3<S2, and a relation of S2<S1<S3. In the relation of S1, S2 and S3, S1 and S3 may satisfy a relation of S3−S1>100 μV/K (K: absolute temperature).

According to example embodiments, a reset current may be reduced in accordance with an increased amount of Peltier heat by Peltier effect. Because an allowable current for a transistor may be reduced, a size of the transistor may be further scaled down, thereby providing an effect of increasing an integration density of a PRAM. According to example embodiments, the reduction of the reset current may be caused by Peltier heat, and may not be related with a size reduction of the lower electrode contact layer. According to example embodiments, an integration density of a PRAM may be increased without an increase of a set resistance.

BRIEF DESCRIPTION OF THE DRAWINGS

Example embodiments will be more clearly understood from the following detailed description taken in conjunction with the accompanying drawings.

FIG. 1 is a diagram illustrating a conventional PRAM;

FIGS. 2(*a*)-2(*c*) are diagrams illustrating a method of operating the PRAM of FIG. 1;

FIG. 3 is a diagram illustrating a phase change memory device according to example embodiments;

FIG. 4 is a diagram illustrating that an upper surface of a phase change layer of the memory device of FIG. 3 is recessed;

FIG. 5 is a diagram illustrating a phase change memory device according to example embodiments;

FIGS. 6(*a*)-6(*b*) illustrate diagrams of a storage node representing a memory device of example embodiments used in an experiment with example embodiments and a storage node of a conventional memory device used for comparison;

FIGS. 7(*a*)-9(*c*) are diagrams illustrating a method of operating a phase change memory device according to example embodiments;

FIGS. 10-17 are diagrams illustrating a method of fabricating a memory device according to example embodiments in accordance with processing sequences; and FIGS. 18-21 are diagrams illustrating a method of fabricating a memory device according to other example embodiments in accordance with processing sequences.

DETAILED DESCRIPTION OF EXAMPLE EMBODIMENTS

Figure 1:
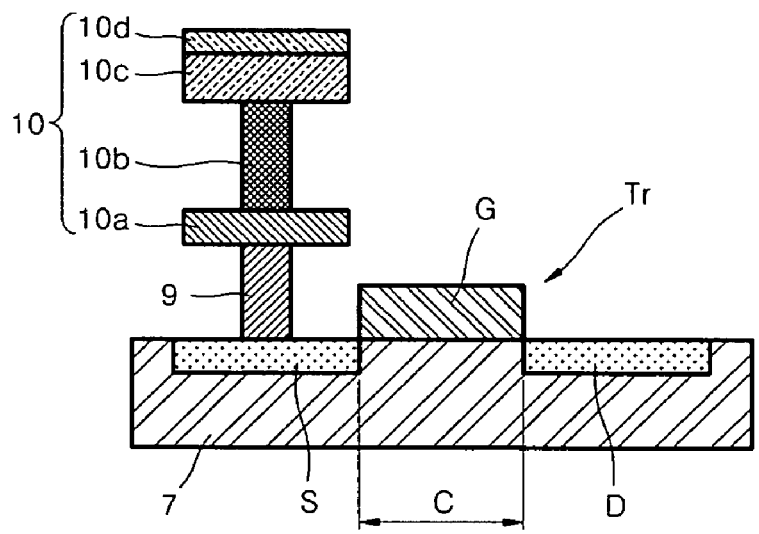
FIGS. 1-21 represent non-limiting, example embodiments as described herein.
Figure 2:
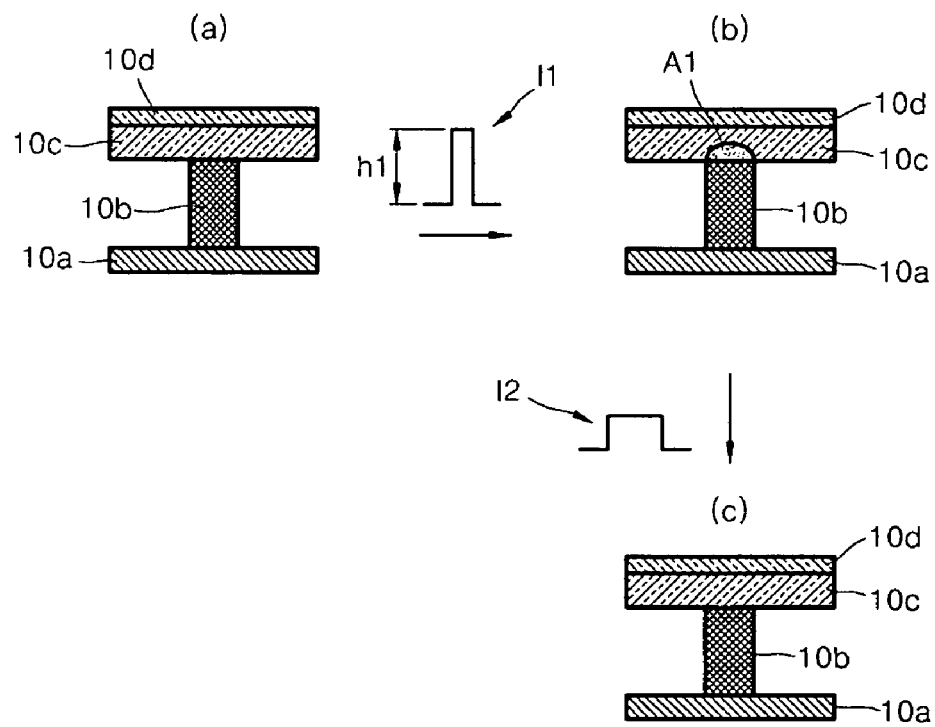

Example embodiments will now be described more fully hereinafter with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

Hereinafter, a phase change memory device, and methods of operating and fabricating the same according to example embodiments will be explained in detail with reference to attached drawings. In the drawings, the thicknesses of layers and regions are exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
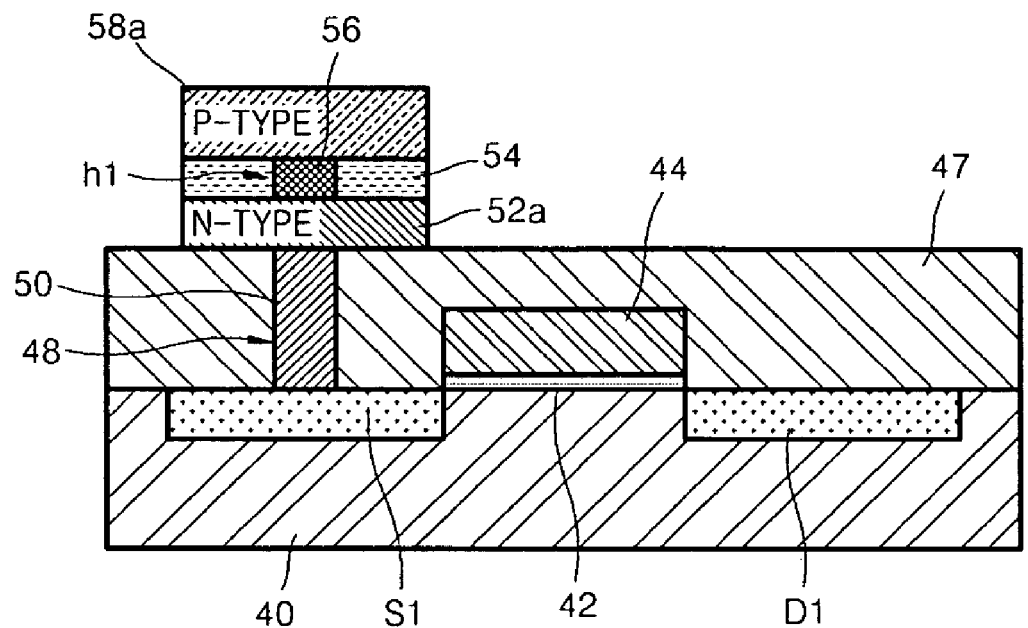

A phase change memory device according to example embodiments will be explained. Referring to FIG. 3, first and second impurity regions S1 and D1 doped with conductive impurities, for example, n-type impurities, may be provided in a substrate 40 of the example embodiment illustrated in FIG. 3 with a predetermined distance. The substrate 40 may be, for example, a p-type silicon substrate. The first and second impurity regions S1 and D1 may have various shapes. One of the first and second impurity regions S1 and D1, for example, the first impurity region S1 may be a source region, and the other one may be a drain region. A gate oxide layer 42 may be disposed on the substrate 40 between the first and second impurity regions S1 and D1, and a gate electrode 44 may be disposed on the gate oxide layer 42.

The substrate 40, the first and second impurity regions S1 and D1, and the gate electrode 44 may constitute a field effect transistor. A first interlayer insulating layer 47 may be disposed on the substrate 40 to cover the transistor. A contact hole 48 may be formed in the first interlayer insulating layer 47 to expose the first impurity region S1. The contact hole 48 may be formed at the position exposing the second impurity region D1 instead of the first impurity region S1. The contact hole 48 may be filled with a conductive plug 50. A lower electrode 52a may be disposed on the first interlayer insulating layer 47 to cover an exposed upper surface of the conductive plug 50. The lower electrode 52a may be an electrode, which is composed of an n-type thermoelectric material having a higher melting point than that of a phase change layer 56 to be formed and having a first seeback coefficient S1.

The n-type thermoelectric material may be one selected from the group consisting of n-SiGe, $Sb_2Te_3$—$Bi_2Te_3$, a material having GeTe as a main component, a material having SnTe as a main component, a material having PbTe as a main component and/or a material having TeAgGeSb as a main component. The materials may include a relatively small amount of a doping material. The n-type thermoelectric material may be a material having a structure of binary skutterudite and an $MX_3$ composition (M=Co, Rh and/or Ir; X=P, As and/or Sb). The n-type thermoelectric material may be a material having a structure of filled skutterudite, and an $RT_4X_{12}$ composition (R=lanthanide element, actinide or alkaline-earth ion; T=Fe, Ru, Os, and X=P, As, or Sb).

The n-type thermoelectric material may be a material having a structure of clathrate, and an $A_8B_{16}E_{30}$ composition with a relatively small amount of doping (A=alkaline earth metal; B=III group element (Ga, Al); E=Si, Ge, or Sn). When the lower electrode 52a is an electrode which is composed of a $Sb_2Te_3$—$Bi_2Te_3$ material as an example of the n-type thermoelectric material, a $Sb_2Te_3$ content of the lower electrode 52a may be lower than a $Bi_2Te_3$ content. A second interlayer insulating layer 54 may be disposed on an upper surface of the lower electrode 52a. A via hole h1 may be formed in the second interlayer insulating layer 54 to expose a portion of the lower electrode 52a. The via hole h1 may be filled with the phase change layer 56. The phase change layer 56 may be a material having a second seeback coefficient S2, for example, GST layer. The first seeback coefficient S1 may be higher or lower than the second seeback coefficient S2. Because the via hole h1 is filled with the phase change layer 56, a depth of the via hole h1 may determine a thickness of the phase change layer 56. Because the thickness of the phase change layer 56 may be about 100 nm or less, for example, about 20 nm, the via hole h1 may be formed with a thickness of the above.

An upper electrode 58a may be disposed on the second interlayer insulating layer 54 to cover the exposed portion of the phase change layer 56 filling the via hole h1. The upper electrode 58a may be an electrode, which is composed of a p-type thermoelectric material having a higher melting point than that of the phase change layer 56 and a third seeback coefficient S3. The p-type thermoelectric material may be one selected from the group consisting of, for example, p-SiGe, $Sb_2Te_3$—$Bi_2Te_3$, a material having GeTe as a main component, a material having SnTe as a main component, a material having PbTe as a main component and a material having TeAgGeSb as a main component. The materials may have a smaller amount of a doping material.

The p-type thermoelectric material may be a material having a structure of binary skutterudite and an $MX_3$ composition (M=Co, Rh, or Ir; X=P, As, or Sb). The p-type thermoelectric material may be a material having a structure of filled skutterudite, and an $RT_4X_{12}$ composition (R=lanthanide element, actinide and/or alkaline-earth ion; T=Fe, Ru, Os, and X=P, As, or Sb). The p-type thermoelectric material may be a material having a structure of clathrate, and an $A_8B_{16}E_{30}$ composition with a relatively small amount of doping (A=alkaline earth metal; B=III group element (Ga, Al); E=Si, Ge, or Sn).

When the upper electrode 58a is an electrode which is composed of a $Sb_2Te_3$—$Bi_2Te_3$ material as an example of the p-type thermoelectric material, a $Sb_2Te_3$ content of the upper electrode 58a may be more than a $Bi_2Te_3$ content. The third seeback coefficient S3 may be higher than the first seeback coefficient S1 (S3>S1), but the third seeback coefficient S3 may be higher or lower than the second seeback coefficient S2 (S3>S2 or S3<S2). When the third seeback coefficient S3 is higher than the first seeback coefficient S1, the first and third seeback coefficients S1 and S3 may satisfy a following formula.

$$S3-S1>100 \mu V/K, (K: absolute temperature) \qquad <Formula 1>$$

When the lower electrode 52a is an electrode, which is composed of an n-type thermoelectric material, and the upper electrode 58a is an electrode, which is composed of a p-type thermoelectric material, the first and third seeback coefficients S1 and S3 may satisfy formula 1, and the first through third seeback coefficients S1 through S3 may satisfy a first relation (S1<S2<S3), but the first through third seeback coefficients S1 through S3 may satisfy a second relation (S2<S1<S3) and/or a third relation (S1<S3<S2).

Types of the thermoelectric materials of the lower electrode 52a and the upper electrode 58a may be opposite to each other. For example, the lower electrode 52a may be a p-type thermoelectric material electrode, and the upper electrode 58a may be an n-type thermoelectric material electrode. As such, when the thermoelectric materials of the lower electrode 52a and the upper electrode 58a have opposite types, the reference numeral S1 may show a seeback coefficient of the upper electrode 58a, and the reference numeral S3 may show a seeback coefficient of the lower electrode 52a. The position where Peltier effect is generated may be different from that before the types of the thermoelectric materials to form the lower electrode 52a and the upper electrode 58a may be opposite to each other. If a direction of the current flowing through the lower electrode 52a and the upper electrode 58a may change reversely while the conductivity types of the thermoelectric materials to respectively form the lower electrode 52a and the upper electrode 58a may be opposite to each other, the position where Peltier effect is generated may not be changed.

Figure 4:
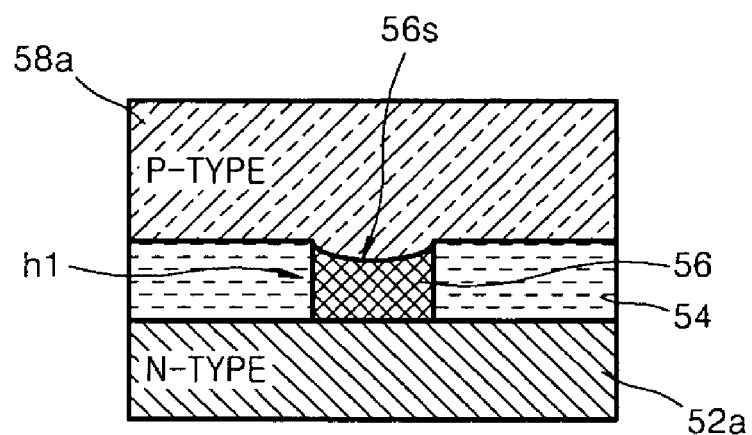

Referring to FIG. 4, an upper surface 56s of the phase change layer 56 filling the via hole h1 may be a recessed surface not a flat surface like the second interlayer insulating layer 54. A portion of the upper electrode 58a contacting the phase change layer 56 may have a shape extending toward the via hole h1, for example, a downwardly-convex shape. A phase change memory device according to example embodiments will be explained. Because a structure of the example embodiment in FIG. 5 is mostly similar to that of the example embodiment in FIG. 3, a following description may be confined to the points that the example embodiment in FIG. 5 may be different from the example embodiment in FIG. 3.

Figure 5:
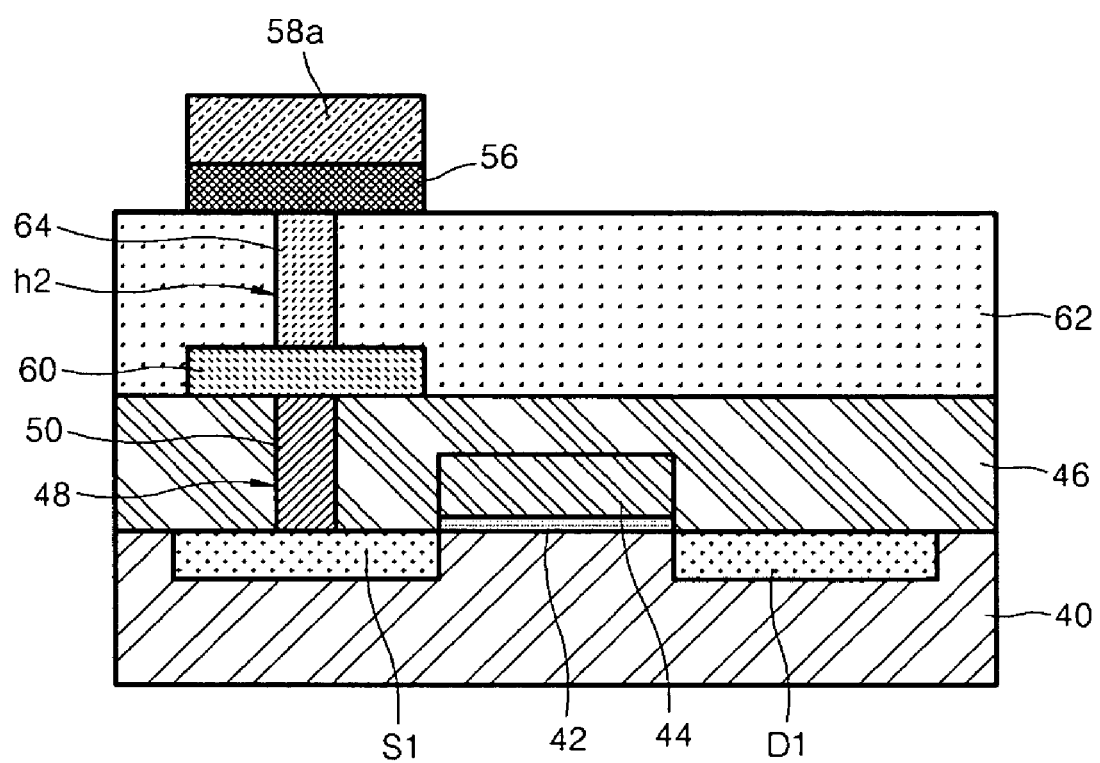

Referring to FIG. 5, a lower electrode 60 may be disposed on a first interlayer insulating layer 46 covering a transistor to cover an exposed upper surface of a conductive plug 50. The lower electrode 60 may also function as a pad layer. The lower electrode 60 may be an electrode which is composed of the same material as that of the lower electrode 52a in example embodiment in FIG. 3. A second interlayer insulating layer 62 may be disposed on the first interlayer insulating layer 46 to cover the lower electrode 60. The second interlayer insulating layer 62 may be composed of the same insulating material as that of the first interlayer insulating layer 46. A contact hole h2 may be formed in the second interlayer insulating layer 62 to expose an upper surface of the lower electrode 60.

The contact hole h2 may be filled with a lower electrode contact layer 64. The lower electrode contact layer 64 may be composed of the same material as that of the lower electrode 60. A phase change layer 56 may be disposed on the second interlayer insulating layer 62 to cover an exposed upper surface of the lower electrode contact layer 64, and an upper electrode 58a may be disposed on the phase change layer 56. The phase change layer 56 and the upper electrode 58a may be the same as those described in the example embodiment in FIG. 3.

A comparison experiment may be performed to check reset current characteristics of a memory device according to example embodiments as described above. In this experiment, a phase change memory device according to example embodiments may be fabricated to have the same structure as that of the example embodiment illustrated in FIG. 3, and a conventional memory device to compare the memory device of example embodiments may be fabricated such that lower and upper electrodes may be composed of TiAlN.

Figure 6:
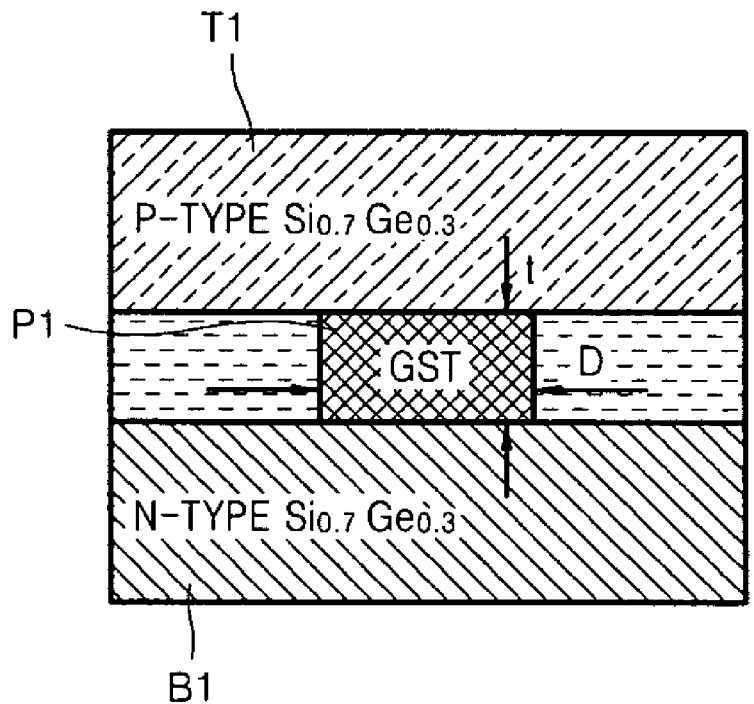
Figure 6:
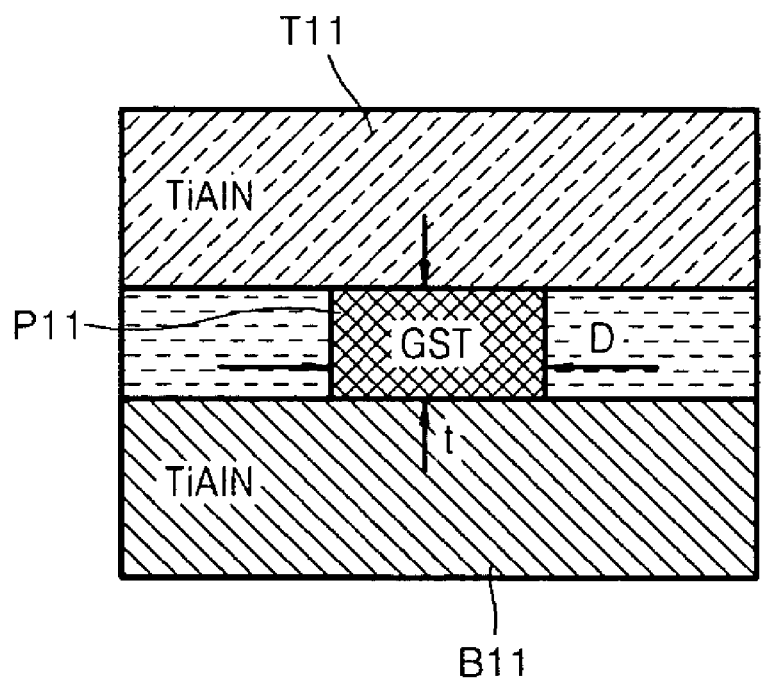

FIG. 6(a) illustrates a storage node of the memory device of example embodiments used in this experiment and FIG. 6(b) illustrates a storage node of the conventional memory device. Referring to FIG. 6(a) and FIG. 6(b), the storage node of example embodiments and the conventional storage node may be the same in their structures, but different in the materials of the upper and lower electrodes. In the storage nodes, phase change layers P1 and P11 may be all formed of GST layers, and a thickness t and a diameter D may be about 20 nm and about 50 nm, respectively.

If examining change of the storage node of example embodiments in this experiment, when a current flowing between upper and lower electrodes T1 and B1 is about 0.69 mA after applying a voltage between the upper and lower electrodes T1 and B1, a portion of a phase change layer S2 contacting the upper and lower electrodes T1 and B1 may be changed to an amorphous state. If examining change of the conventional storage node in this experiment, when a current flowing between upper and lower electrodes T11 and B11 is about 0.79 mA after applying a voltage between the upper and lower electrodes T11 and B11, a portion of a phase change layer P11 contacting the upper and lower electrodes T11 and B11 may be changed to amorphous state.

From the experiment, it may be acknowledged that a reset current of the storage node of example embodiments may be lower than a reset current of the conventional storage node. The experiment result coincides with the expectation that the phase change layer of the memory device of example embodiments may be changed to an amorphous state at a reset current lower than that of the conventional memory device because a heat due to Peltier effect may be generated in addition to a joule heat. Because Peltier effect has no relation with geometrical shapes of the upper and lower electrodes contacting the phase change layer, a side effect (e.g., an increase of a set resistance related with Peltier effect) may not be generated in the memory devices of example embodiments.

Figure 8:
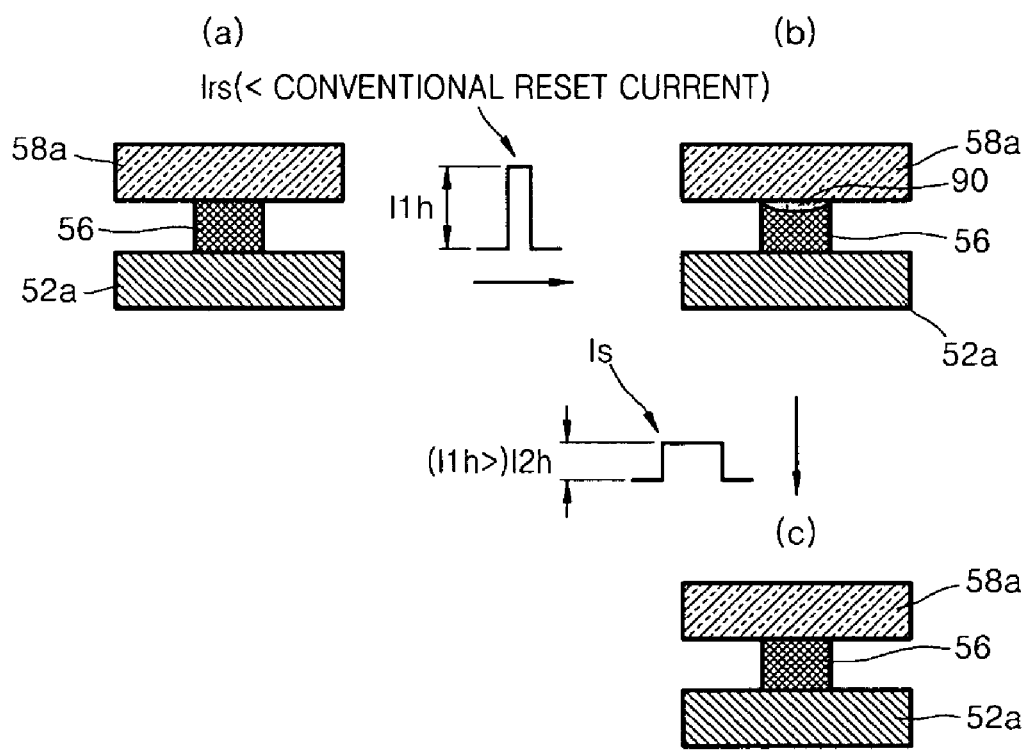
Figure 9:
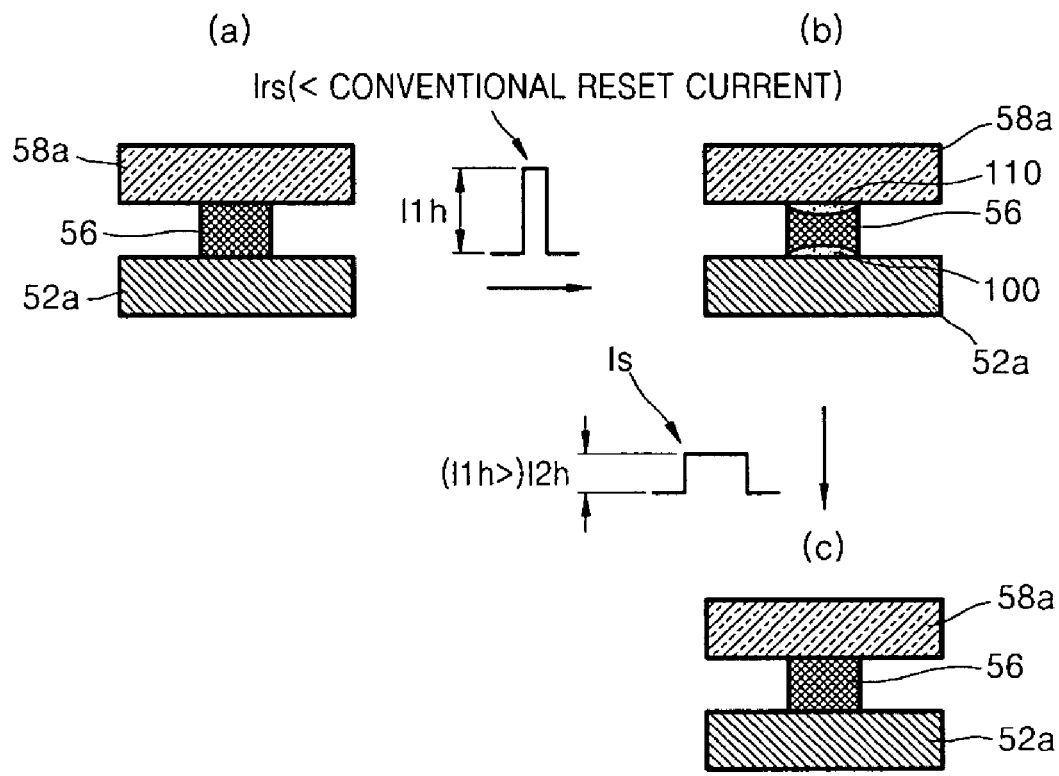

A method of operating a memory device according to example embodiments described above will be explained in reference to FIGS. 7(a)-9(c). As a transistor is always in an on-state in the operating method of example embodiments, the transistor may not be illustrated in FIGS. 7(a)-9(c). FIGS. 7(a)-9(c) illustrate a method of operating the example embodiment illustrated in FIG. 3, and FIG. 7(a)-7(c) illustrate an operating method when a relation between seeback coefficients of a lower electrode 52a, a phase change layer 56, and an upper electrode 58a of the example embodiment illustrated in FIG. 3, for example, first through three seeback coefficients S1 through S3 may be S1<S3<S2. FIGS. 8(a)-8(c) illustrate an operating method when a relation between the first through three seeback coefficients S1 through S3 is S2<S1<S3. FIGS. 9(a)-9(c) illustrate an operating method when a relation between the first through three seeback coefficients S1 through S3 is S1<S2<S3.

<Write>

Figure 7:
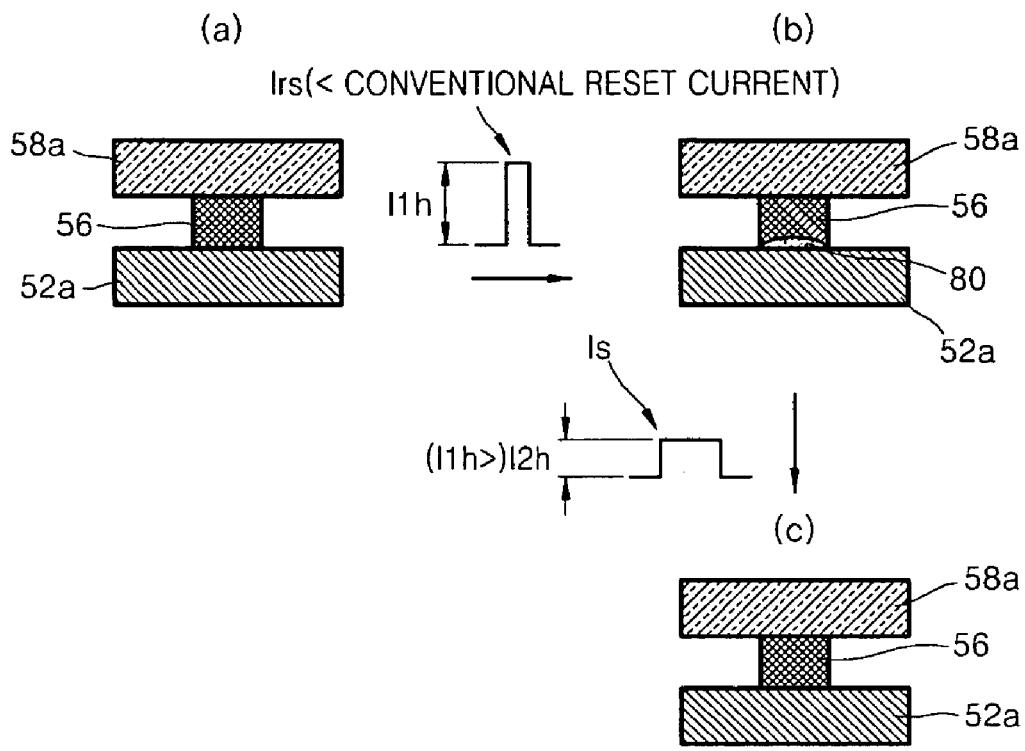

Referring to FIG. 7, as shown in FIG. 7(a), a write voltage may be applied between the upper and lower electrodes 58 and 52 for a predetermined time, for example, dozens of nanoseconds such that a reset current Irs may be flowed to the phase change layer 56 having a crystal state. The reset current Irs may be a pulse current having a predetermined height I1h, and smaller in intensity than a conventional reset current. When the write voltage is applied between the lower electrode 52a and the upper electrode 58a in accordance with a relation (S1<S3<S2) between the seeback coefficients of the lower electrode 52a, the phase change layer 56, and the upper electrode 58a, a temperature of the portion of the phase change layer 56 contacting the lower electrode 52a may be momentarily changed to a phase change temperature or higher. The portion of the phase change layer 56 contacting the lower electrode 52a may be changed to an amorphous region 80 as illustrated in FIG. 7(b). When the portion of the phase change layer 56 is changed to the amorphous region 80, an electrical resistance of the phase change layer 56 may increase. When the amorphous region 80 is formed as above, and the electrical resistance of the phase change layer 56 increases, bit data 1 may be recorded in the example embodiment illustrated in FIG. 3.

When the amorphous region 80 of the phase change layer 56 has a crystal state, and thus, the entire phase change layer 56 comes to have a crystal state, bit data 0 may be recorded in the example embodiment illustrated in FIG. 3. In order to change the amorphous region 80 of the phase change layer 56 into a crystal state, a predetermined voltage may be applied between the lower electrode 58a and the upper electrode 52a such that a set current Is may be flowed to the phase change layer 56 in a state that the amorphous region 80 exists in the phase change layer 56 as illustrated in FIG. 7(b). The set current Is as a pulse current may have a current intensity I2h, which is smaller than that of the reset current Irs. An applying time of the set current Is may be longer than that of the reset current Irs.

When the set current Is is applied, the amorphous region 80 of the phase change layer 56 may be changed to a crystal state, and thus, the entire phase change layer 56 may be changed to a crystal state as illustrated in FIG. 7(c). The respective states of the phase change layer 56 in FIGS. 7(c) and (a) may be the same. The process of applying the set current Is to the phase change layer 56 illustrated in FIG. 7(b) may be considered as a process of erasing bit data 1 recorded in the phase change layer 56, or as a process of recording bit data 0 to the phase change layer 56.

Referring to FIGS. 8(a)-8(c), when a relation between seeback coefficients of the lower electrode 52a, the phase change layer 56, and the upper electrode 58a, for example, first through three seeback coefficients S1 through S3 is S2<S1<S3, and when the same write voltage as that in the operating method illustrated in FIGS. 7(a)-7(c) is applied between the lower electrode 52a and the upper electrode 58a, a temperature of the portion of the phase change layer 56 contacting the upper electrode 58a may be momentarily changed to a phase change temperature or higher as illustrated in FIG. 8(a), so that the portion of the phase change layer 56 contacting the upper electrode 58a may change to an amorphous region 90 as illustrated in FIG. 8(b). Any change may not be found in the portion of the phase change layer 56 contacting the lower electrode 52a as illustrated in FIG. 8(c).

As above, when the seeback coefficients S1, S2, and S3 of the lower electrode 52a, the phase change layer 56, and the upper electrode 58a satisfy a relation of S2<S1<S3, operating characteristics of the example embodiment illustrated in FIG. 3 may be the same as the characteristics illustrated in FIGS. 7(a)-7(c) except for the position of the amorphous region 90 formed in the phase change layer 56 during the operating process of the example embodiment illustrated in FIG. 3. As illustrated in FIGS. 7(a)-7(c) and 8(a)-8(c), even though positions where the amorphous regions are formed in the phase change layer 56 are different, current-resistance characteristics of the example embodiment illustrated in FIG. 3 may not be changed. The operating methods illustrated in FIGS. 7(a)-7(c) and 8(a)-8(c) may be substantially same.

Referring to FIGS. 9(a)-9(c), when the seeback coefficients S1, S2, and S3 of the lower electrode 52a, the phase change layer 56, and the upper electrode 58a satisfy a relation of S1<S2<S3, and when the same voltage as the write voltage applied in the operating method of FIGS. 7(a)-7(c) may be applied between the lower electrode 52a and the upper electrode 58a as illustrated in FIG. 9(a), first and second amorphous regions 100 and 110 may be formed in the phase change layer 56 as illustrated in FIG. 9(b). The first amorphous region 100 may be formed at a position where the phase change layer 56 contacts the lower electrode 52a, and the second amorphous region 110 may be formed at a position where the phase change layer 56 contacts the upper electrode 58a.

As such, a resistance of the phase change layer 56 when amorphous regions 100 and 110 exist at two positions of the phase change layer 56 may be higher than that of the phase change layer 56 when the amorphous region 80 or 90 exists only at one position of the phase change layer 56 as illustrated in FIGS. 7(a)-7(c) or FIGS. 8(a)-8(c). In the operating method of the example embodiment illustrated in FIG. 3 and illustrated in FIGS. 9(a)-9(c), a difference between a resistance of the phase change layer 56 when the first and second amorphous regions 100 and 110 may be formed in the phase change layer 56, for example, when bit data 1 is recorded, and a resistance of the phase change layer 56 when an amorphous region does not exist in the phase change layer 56, for example, when bit data 0 is recorded, may be greater than a resistance difference in the operating method illustrated in FIGS. 7(a)-7(c) or FIGS. 8(a)-8(c).

<Write>

A read voltage may be applied between the upper electrode 58a and the lower electrode 52a in a writing process such that a current may not change a phase of the amorphous region formed in the phase change layer 56, for example, a current lower than a set current may be flowed through the phase change layer 56 as illustrated in FIG. 9(c). The read voltage may be intended to measure a resistance of the phase change layer 56. The resistance of the phase change layer 56 measured by applying the read voltage may be compared with a reference resistance. As a result of the comparison, when the measured resistance of the phase change layer 56 is higher than the reference resistance, bit data 1 may be recorded in the memory device. When the measured resistance of the phase change layer 56 is lower than the reference resistance, bit data 0 may be recorded in the memory device.

Figure 10:
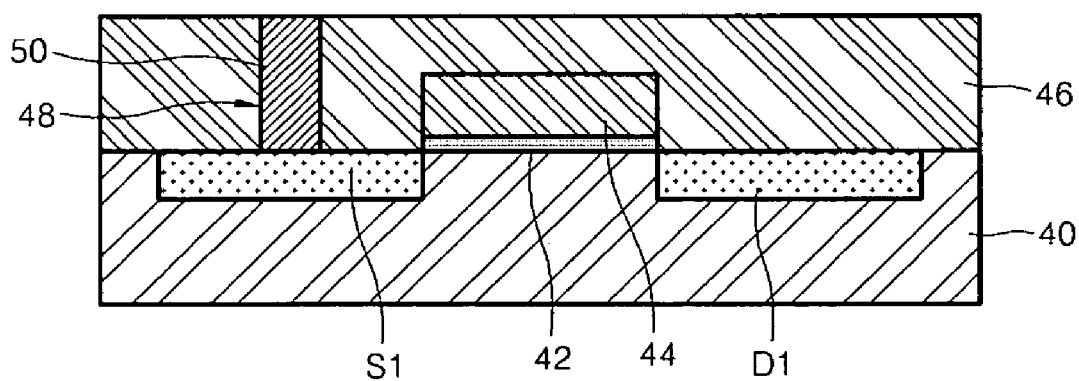

A method of fabricating a phase change memory device according to example embodiments will be explained. A method of fabricating the example embodiment illustrated in FIG. 3 will be explained. Referring to FIG. 10, a substrate 40 may be divided into an active region where device elements will be formed, and a field region where device elements will not be formed. The substrate 40 may be formed of a silicon substrate including predetermined conductive impurities, for example, p-type impurities. A field oxide layer (not shown) may be formed in the field region to isolate elements. A gate oxide layer 42 and a gate electrode 44 may be sequentially formed on a predetermined portion of the active region of the substrate 40. The active region may be doped with conductive impurities having a conductivity type opposite to that of the impurities doping the substrate 40, for example, n-type impurities, using the gate electrode 44 as a mask.

First and second impurity regions S1 and D1 may be formed with the gate electrode 44 disposed therebetween. The first and second impurity regions S1 and D1 may be formed with a lightly doped drain (LDD) type of impurities. One of the first and second impurity regions S1 and D1 may be a source region, and the other one thereof may be a drain region. A field effect transistor may be formed in the substrate 40. The field effect transistor may be a switching element, and may be replaced with a different switching element, for example, a diode.

A first interlayer insulating layer 46 covering the transistor may be formed on the substrate 40, and a contact hole 48 may be formed in the first interlayer insulating layer 46 to expose the first impurity region S1. The contact hole 48 may be formed at a position where the second impurity region D1 is exposed instead of the first impurity region S1. After a conductive material (not shown) filling the contact hole 48 is formed on the first interlayer insulating layer 46, an upper surface of the conductive material may be planarized until the first interlayer insulating layer 46 is exposed. The contact hole 48 may be filled with a conductive plug 50.

Figure 11:
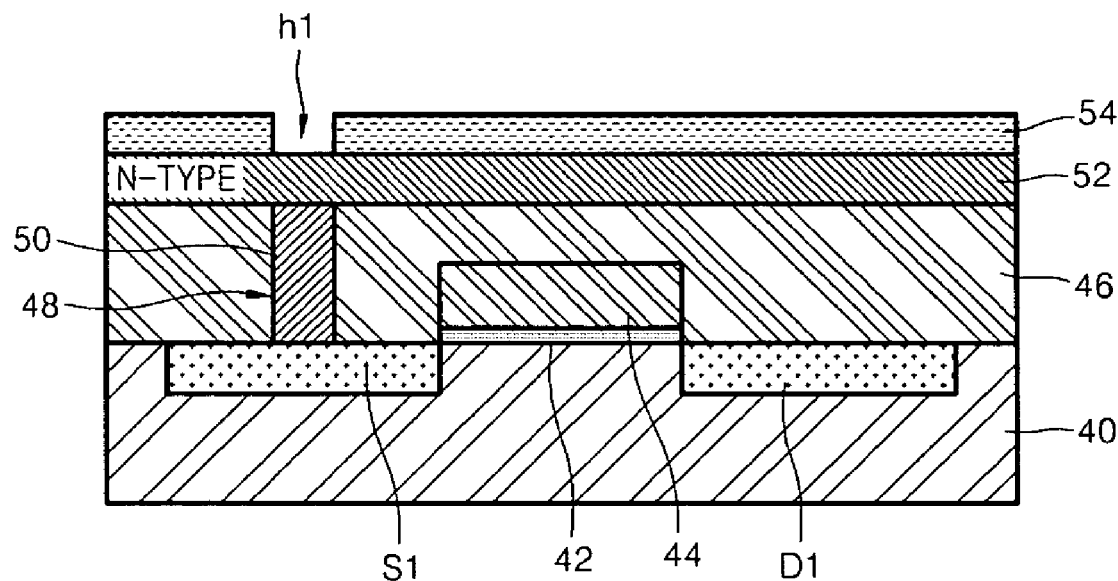

Referring to FIG. 11, a lower electrode layer 52 may be formed on the first interlayer insulating layer 46 to cover an exposed upper surface of the conductive plug 50. The lower electrode layer 52 may be formed of an n-type thermoelectric material layer having a melting point higher than that of a phase change layer 56 to be formed later, and having a first seeback coefficient S1. The n-type thermoelectric material layer may be one selected from the group consisting of an n-SiGe layer, a $Sb_2Te_3$—$Bi_2Te_3$ layer, a material layer having GeTe as a main component, a material layer having SnTe as a main component, a material layer having PbTe as a main component and a material layer having TeAgGeSb as a main component. If necessary, the material layers may be doped with a relatively small amount of a doping material.

The n-type thermoelectric material layer may be formed of a material layer having a structure of binary skutterudite and an $MX_3$ composition (M=Co, Rh or Ir; X=P, As or Sb). The n-type thermoelectric material layer may be formed of a material layer having a structure of filled skutterudite and an $RT_4X_{12}$ composition (R=lanthanide element, actinide or alkaline-earth ion; T=Fe, Ru or Os and X=P, As or Sb). The n-type thermoelectric material layer may be formed of a material layer having a structure of clathrate, and an $A_8B_{16}E_{30}$ composition with a little doping (A=alkaline earth metal; B=III group element (Ga, Al); E=Si, Ge or Sn).

In the material layers of the n-type thermoelectric material layer, the $Sb_2Te_3$—$Bi_2Te_3$ layer may have a $Sb_2Te_3$ content lower than a $Bi_2Te_3$ content. The lower electrode layer 52 may be formed of a p-type thermoelectric material layer. After the lower electrode layer 52 is formed, a second interlayer insulating layer 54 may be formed on the lower electrode layer 52. The second interlayer insulating layer 54 may be formed of, for example, a silicon oxynitride (SiON) layer. A thickness of the phase change layer to be formed in a subsequent process may be substantially determined by a thickness of the second interlayer insulating layer 54. The second interlayer insulating layer 54 may be formed by considering the thickness of the phase change layer. For example, the second interlayer insulating layer 54 may be formed with a thickness of about 100 nm or smaller, and may be formed with a thickness of about 20 nm. A via hole h1 may be formed in the second interlayer insulating layer 54 to expose the lower electrode layer 52. The via hole h1 may be formed over the contact hole 48.

Figure 12:
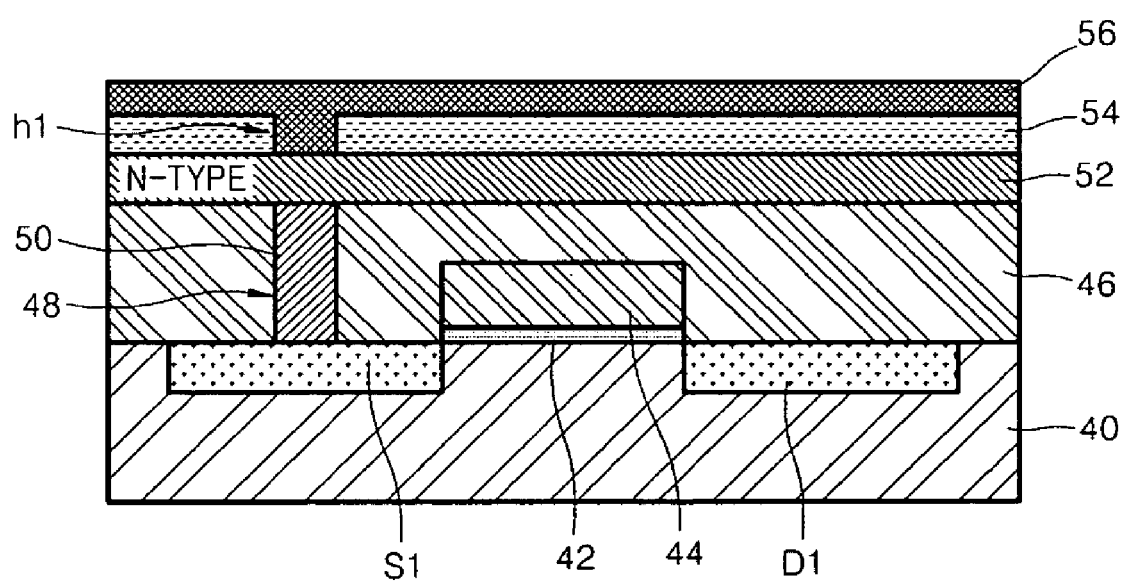
Figure 13:
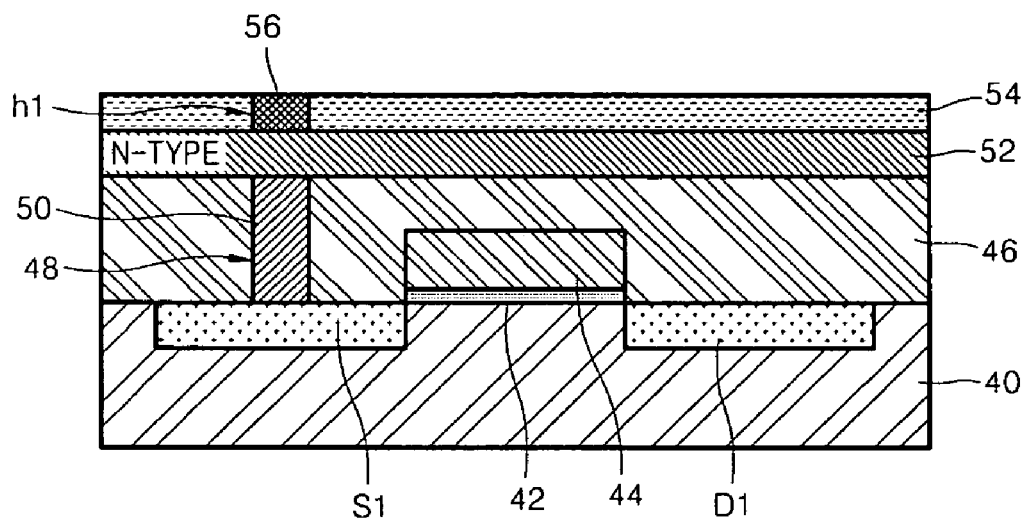

Referring to FIG. 12, a phase change layer 56 may be formed on the second interlayer insulating layer 54 to fill the via hole h1. An upper surface of the phase change layer 56 may be polished using a predetermined polishing method, for example, a chemical mechanical polishing (CMP) method or an etch-back method. The polishing method may be performed until the second interlayer insulating layer 54 is exposed. As a result of the polishing, the portion of the phase change layer 56 formed around the via hole h1 may be removed, and the phase change layer 56 may remain only inside the via hole h1. FIG. 13 illustrates the result. The phase change layer 56 may be formed of a material layer having a melting point lower than that of the lower electrode layer 52 and having a second seeback coefficient S2, for example, a $Ge_2Sb_2Te_5$ layer or a doped $Ge_2Sb_2Te_5$ layer.

Figure 14:
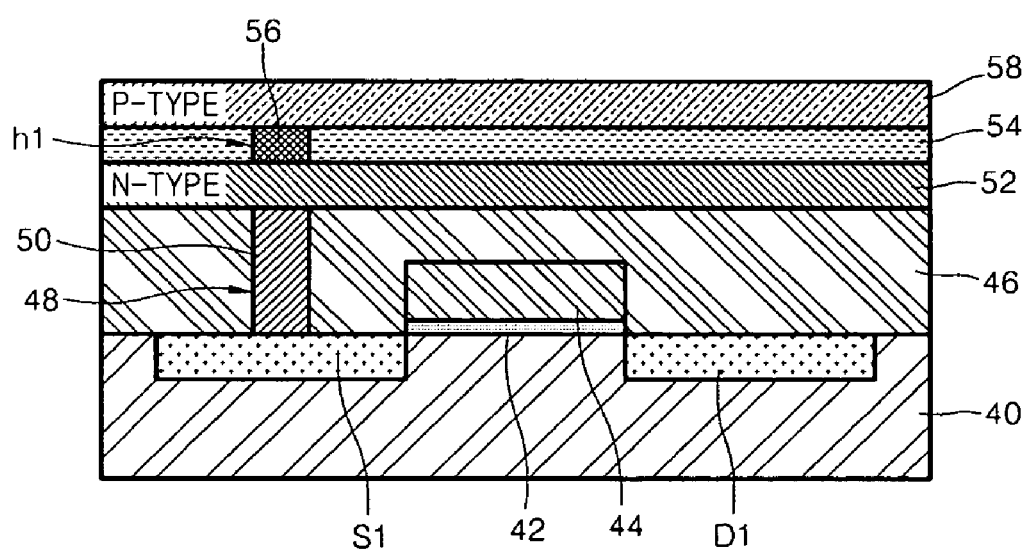

Referring to FIG. 14, an upper electrode layer 58 may be formed on the second interlayer insulating layer 54 to cover the exposed portion of the phase change layer 56 filling the via hole h1. The upper electrode layer 58 may be formed of a p-type thermoelectric material layer having a melting point higher than that of the phase change layer 56 and having a third seeback coefficient S3.

The p-type thermoelectric material layer may be formed of one selected from the group consisting of a p-SiGe layer, a $Sb_2Te_3$—$Bi_2Te_3$ layer, a material layer having GeTe as a main component, a material layer having SnTe as a main component, a material layer having PbTe as a main component and/or a material layer having TeAgGeSb as a main component. If necessary during the processes of forming the p-type thermoelectric material layer, the material layers used for the p-type thermoelectric material layer may be doped with a relatively small amount of a doping material. The p-type thermoelectric material layer may be formed of a material layer having a structure of binary skutterudite and an $MX_3$ composition (M=Co, Rh or Ir; X=P, As or Sb).

The p-type thermoelectric material layer may be formed of a material layer having a structure of filled skutterudite, and an $RT_4X_{12}$ composition (R=lanthanide element, actinide or alkaline-earth ion; T=Fe, Ru, Os, and X=P, As or Sb). The p-type thermoelectric material layer may be formed of a material layer having a structure of clathrate, and an $A_8B_{16}E_{30}$ composition with a little doping (A=alkaline earth metal; B=III group element (Ga, Al); E=Si, Ge, or Sn). When the upper electrode layer 58 is formed of a $Sb_2Te_3$—$Bi_2Te_3$ layer, a $Sb_2Te_3$ content may be greater than a $Bi_2Te_3$ content. The third seeback coefficient S3 may be higher than the first seeback coefficient S1 (S3>S1), but the third seeback coefficient S3 may be higher or lower than the second seeback coefficient S2 (S3>S2 or S3<S2). When the third seeback coefficient S3 is higher than the first seeback coefficient S1, the first and third seeback coefficients S1 and S3 may satisfy Formula 1.

The lower electrode layer 52 may be formed of the n-type thermoelectric material layer, and the upper electrode layer 58 may be formed of the p-type thermoelectric material layer, the first and third seeback coefficients S1 and S3 may satisfy Formula 1, and the first through third seeback coefficients S1-S3 may satisfy a first relation (S1<S2<S3), or may satisfy a second relation (S2<S1<S3) or a third relation (S1<S3<S2).

The lower electrode layer 52 may be formed of the p-type thermoelectric material layer, and the upper electrode layer 58 may be formed of the n-type thermoelectric material layer. If the upper electrode layer 58 and the lower electrode layer 52 satisfy the condition that they may be respectively formed of thermoelectric material layers having opposite conductivity types, one of the upper electrode layer 58 and the lower electrode layer 52 may be formed of any one of the n-type thermoelectric material layer and the p-type thermoelectric material layer.

When the lower electrode layer 52 is formed of any one of the p-type thermoelectric material layers, and the upper electrode layer 58 is formed of any one of the n-type thermoelectric material layers, the reference numeral S1 in the relation of the seeback coefficients may indicate a seeback coefficient of the upper electrode layer 58 and the reference numeral S3 may indicate a seeback coefficient of the lower electrode layer 52. The position where Peltier effect may be generated may be different from that before the types of the thermoelectric material layers to form the lower electrode layer 52 and the upper electrode layer 58 may be opposite to each other. If a direction of the current flowing through the lower electrode layer 52 and the upper electrode layer 58 during an operating process is changed reversely, the position where Peltier effect is generated may not be changed.

Figure 15:
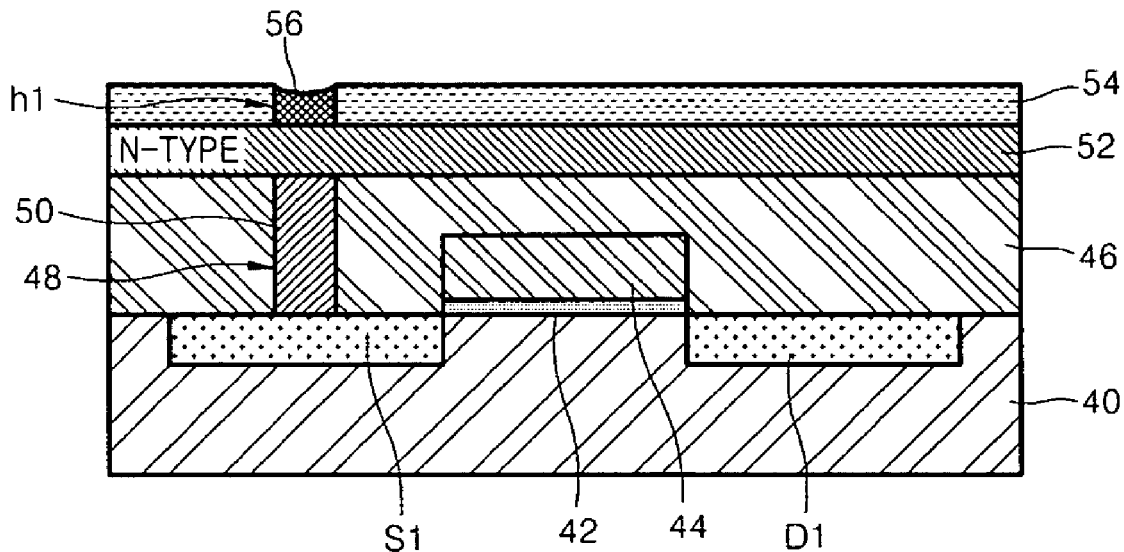
Figure 16:
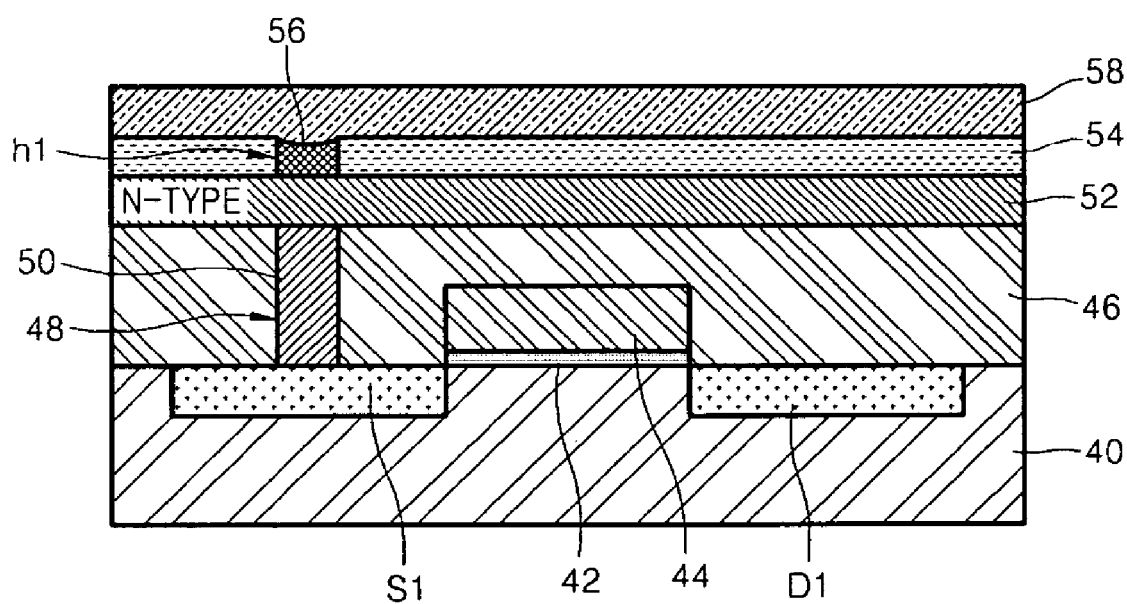

After the upper electrode layer 58 is formed, a photosensitive layer pattern (not shown) may be formed on a predetermined portion of the upper electrode layer 58. The photosensitive layer pattern may be formed at a position to cover the via hole 56. The upper electrode layer 58, the second interlayer insulating layer 54, and the lower electrode layer 52 may be sequentially etched using the photosensitive layer pattern as an etch mask. After the etching, the photosensitive layer pattern may be removed. The example embodiment illustrated in FIG. 3 may be fabricated. During the process of planarizing the phase change layer 56 of FIG. 12, the portion of the phase change layer 56 filling the via hole h1 may be formed such that its upper surface may be recessed as illustrated in FIG. 15, and then, in this state as above, the upper electrode layer 58 may be formed on the second interlayer insulating layer 54 to fill the recessed upper surface of the via hole h1 as illustrated in FIG. 16. After the recessed upper surface of the phase change layer 56 filling the via hole in the state illustrated in FIG. 15, the upper electrode layer 56 may be formed on the second interlayer insulating layer 54.

Figure 17:
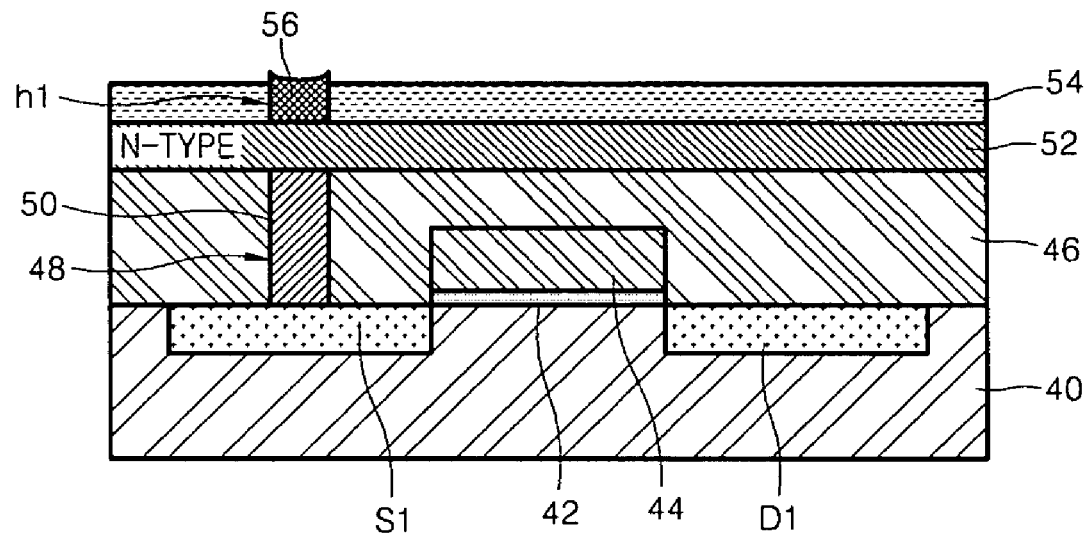

A portion of the second interlayer insulating layer 54 around the phase change layer 56 having a recessed upper surface may be removed as illustrated in FIG. 17, so that a height of the upper surface of the second interlayer insulating layer 54 may be lower than that of the recessed upper surface of the phase change layer 56. In order to achieve the result, the resultant structure illustrated in FIG. 15 may be wet-etched using an etchant having a higher etch selectivity with respect to the second interlayer insulating layer 54 than that with respect to the phase change layer 56.

As above, because the height of the upper surface of the second interlayer insulating layer 54 is lower, the phase change layer 56 filling the via hole h1 may have a protruded shape as illustrated in FIG. 17. In this state, the protruded portion of the phase change layer 56 may be polished and removed. The upper surface of the phase change layer 56 may become flat as illustrated in FIG. 13. The upper electrode layer 58 may be formed on the second interlayer insulating layer 54 as illustrated in FIG. 14.

Figure 18:
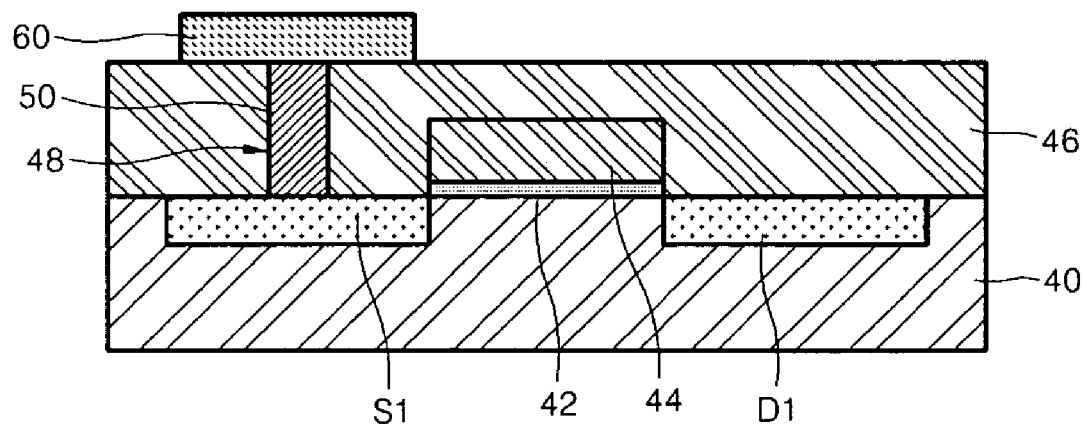

A method of fabricating the memory device according to example embodiments will be explained in reference to FIGS. 18-21. Referring to FIG. 18, a contact hole 48 may be formed in a first interlayer insulating layer 46 by the method of fabricating the example embodiment illustrated in FIG. 3, and the contact hole 48 may be filled with a conductive plug 50. A lower electrode 60 may be formed on the first interlayer insulating layer 46. The lower electrode 60 may be formed of the thermoelectric material layer to form the lower electrode layer 52 as explained in the method of fabricating the example embodiment illustrated in FIG. 3.

Figure 19:
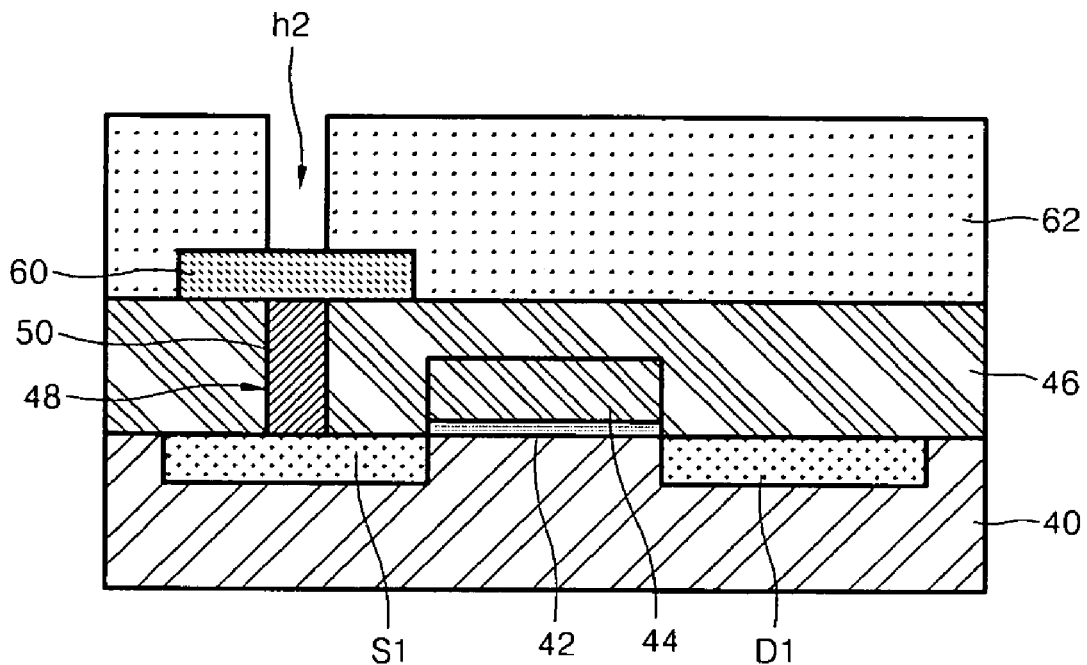
Figure 20:
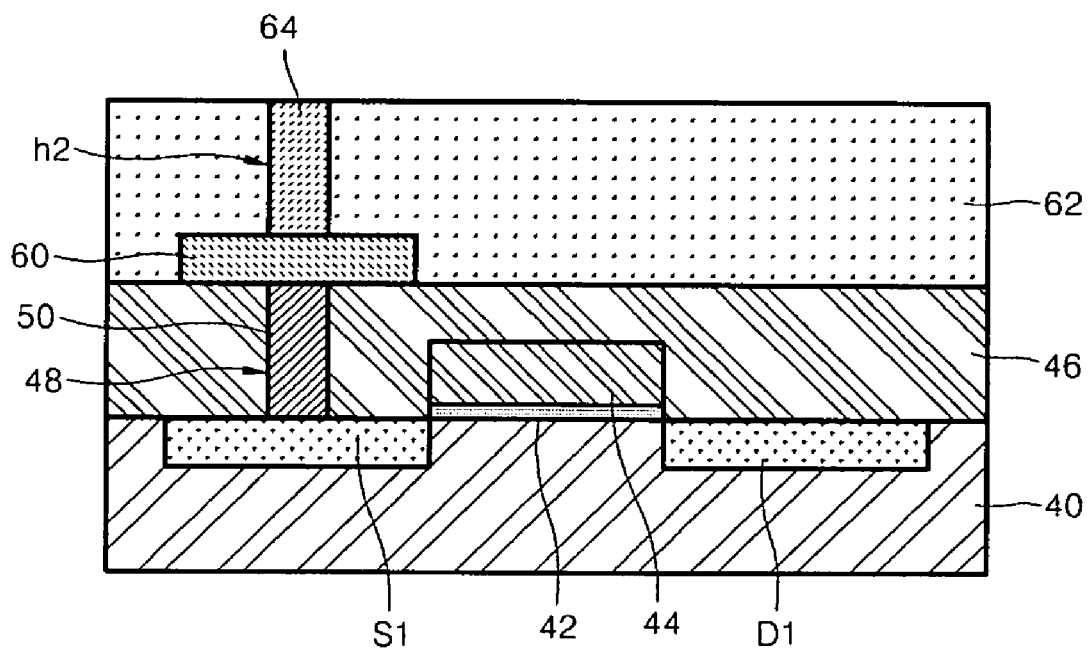

Referring to FIG. 19, a second interlayer insulating layer 62 may be formed on the first interlayer insulating layer 42 to cover the lower electrode 60. The second interlayer insulating layer 62 may be composed of the same material as that of the first interlayer insulating layer 46. After a via hole h2 exposing the lower electrode 60 is formed in the second interlayer insulating layer 62, the via hole h2 may be filled with a lower electrode contact layer 64 as illustrated in FIG. 20. An upper surface of the lower electrode contact layer 64 may be formed recessed or flat during the process of forming the lower electrode contact layer 64. The lower electrode contact layer 64 may be composed of a thermoelectric material having the same characteristics as that of the lower electrode 60. The lower electrode contact layer 64 may have the same seeback coefficient as that of the lower electrode 60.

Figure 21:
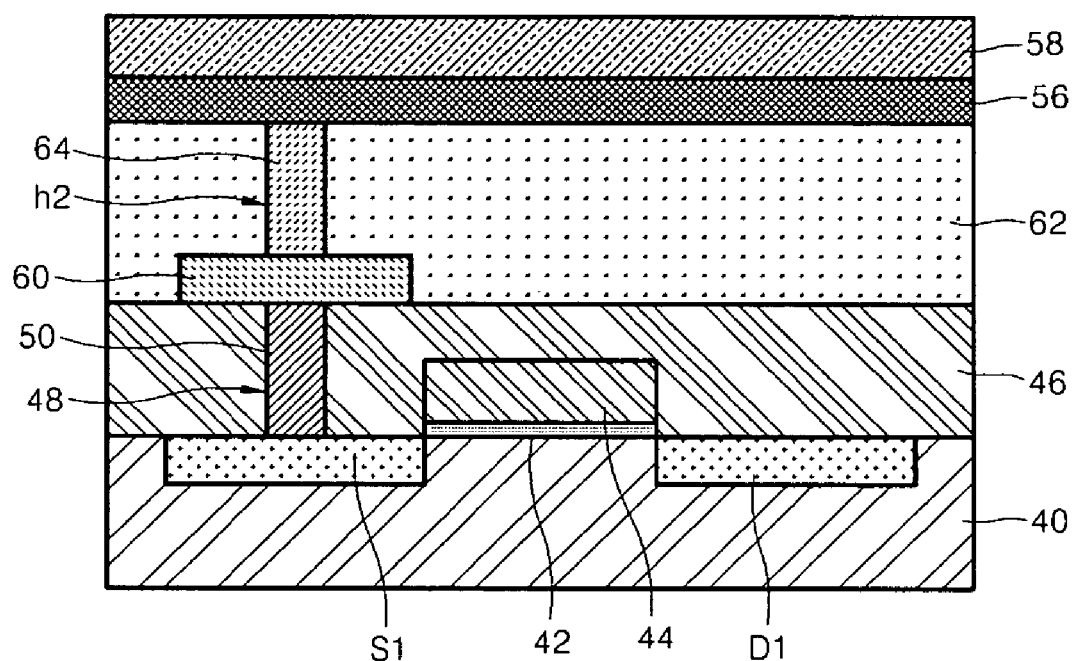

A phase change layer 56 may be formed on the second interlayer insulating layer 62 to cover an exposed surface of the lower electrode contact layer 64 as illustrated in FIG. 21, and an upper electrode layer 58 may be formed on the phase change layer 56. The phase change layer 56 and the upper electrode layer 58 may be the same as explained in the method of fabricating the example embodiment illustrated in FIG. 3. After the upper electrode layer 58 is formed, a photosensitive layer pattern (not shown) may be formed on the upper electrode layer 58 to confine a storage node region, and using the photosensitive layer pattern as an etch mask, the upper electrode layer 58 and the phase change layer 56 may be sequentially etched. After the etching, the photosensitive layer pattern may be removed. The example embodiment having the structure as illustrated in FIG. 5 may be fabricated.

As many descriptions have been made in detail as above, but they may be interpreted as example embodiments rather than confining the scope of example embodiments. For example, it may be understood to those skilled in this art that the lower electrode 52a, the lower electrode contact layer 64, and the upper electrode 58a may be formed of thermoelectric materials other than the p-type and n-type thermoelectric materials as described above. The phase change layer 56 may be formed of a material layer other than the GST layer. A method of operating the phase change memory device may be performed by reversely applying the directions of the reset current and the set current. The scope of example embodiments may not be limited to the embodiments as described above, but may be defined by the following claims.

As described above, in the phase change memory device of example embodiments, the lower electrode 52a and the upper electrode 58a of the storage node, or the lower electrode contact layer 64 and the upper electrode 58a may be composed of thermoelectric materials having opposite conductivity types. The seeback coefficients S1, S2, and S3 of the lower electrode 52a (or the lower electrode contact layer 64), the phase change layer 56, and the upper electrode 58a satisfy a first relation (S1<S2<S3), a second relation (S2<S1<S3), and a third relation (S1<S3<S2).

Peltier heat may be generated at the interface between the lower electrode 52a and the phase change layer 56, the interface between the upper electrode 58a and the phase change layer 56, or the two interfaces between the upper and lower electrodes and the phase change layer 56 due to difference of seeback coefficients. A reset current may be reduced in accordance with an increase of the Peltier heat by example embodiments. As an allowable current of the transistor may be reduced, the size of the transistor may be further reduced, which provides a result of increasing an integration density of the phase change memory device. The decrease of the reset current may be caused by the Peltier heat, and may not be related with the size reduction of the lower electrode contact layer 64. According to example embodiments, an integration density of the phase change memory device may be increased without an increase of a set resistance.

While example embodiments have been particularly shown and described with reference to example embodiments thereof, it will be understood by those of ordinary skill in the art that various changes in form and details may be made therein without departing from the spirit and scope of the following claims.

What is claimed is:

1. A storage node comprising:
a lower electrode;
a phase change layer on the lower electrode; and
an upper electrode on the phase change layer, wherein
the lower electrode and the upper electrode are composed of thermoelectric materials having a melting point higher than that of the phase change layer, and having different conductivity types.

2. A phase change memory device comprising:
a switching element; and
the storage node of claim 1, the lower electrode connected to the switching element.

3. The phase change memory device of claim 2, wherein the switching element is a transistor type or a diode type.

4. The storage node of claim 1, wherein an upper surface of the lower electrode has a recessed shape.

5. The storage node of claim 1, further comprising:
a lower electrode contact layer between the lower electrode and the phase change layer.

6. The storage node of claim 5, wherein the lower electrode contact layer is composed of a thermoelectric material having the same conductivity type as that of the lower electrode.

7. The storage node of claim 1, wherein a thickness of the phase change layer is about 100 nm or less.

8. The storage node of claim 1, wherein the lower electrode is composed of an n-type thermoelectric material and the upper electrode is composed of a p-type thermoelectric material.

9. The storage node of claim 8, wherein, when seeback coefficients of the lower electrode, the phase change layer, and the upper electrode are S1, S2 and S3 respectively, S1, S2 and S3 satisfy one relation selected from the group consisting of a relation of S1<S2<S3, a relation of S1<S3<S2, and a relation of S2<S1<S3.

10. The storage node of claim 9, wherein in the relation of S1, S2 and S3, S1 and S3 satisfy a relation of S3−S1>100 μV/K (K: absolute temperature).

11. The storage node of claim 8, wherein the n-type thermoelectric material is one selected from the group consisting of n-SiGe; $Sb_2Te_3$—$Bi_2Te_3$ (a $Sb_2Te_3$ content<a $Bi_2Te_3$ content); a material having GeTe as a main component; a material having SnTe as a main component; a material having PbTe as a main component; a material having TeAgGeSb as a main component; a material having a structure of binary skutterudite and an $MX_3$ composition (M=Co, Rh, or Ir; X=P, As, or Sb); a material having a structure of filled skutterudite and an $RT_4X_{12}$ composition (R=lanthanide element, actinide or alkaline-earth ion; T=Fe, Ru, Os, and X=P, As, or Sb); and a material having a structure of clathrate and an $A_8B_{16}E_{30}$ composition with a little doping (A=alkaline earth metal; B=III group element (Ga, Al); E=Si, Ge, or Sn).

12. The storage node of claim 8, wherein the p-type thermoelectric material is one selected from the group consisting of p-SiGe; $Sb_2Te_3$—$Bi_2Te_3$ (a $Sb_2Te_3$ content>a $Bi_2Te_3$ content); a material having GeTe as a main component; a material having SnTe as a main component; a material having PbTe as a main component; a material having TeAgGeSb as a main component; a material having a structure of binary skutterudite and an $MX_3$ composition (M=Co, Rh, or Ir; X=P, As, or Sb); a material having a structure of filled skutterudite and an $RT_4X_{12}$ composition (R=lanthanide element, actinide or alkaline-earth ion; T=Fe, Ru, Os, and X=P, As, or Sb); and a material having a structure of clathrate and an $A_8B_{16}E_{30}$ composition with a little doping (A=alkaline earth metal; B=III group element (Ga, Al); E=Si, Ge, or Sn).

13. The storage node of claim 1, wherein the upper electrode is composed of an n-type thermoelectric material, and the lower electrode is composed of a p-type thermoelectric material.

14. The storage node of claim 13, wherein the n-type thermoelectric material is one selected from the group consisting of n-SiGe; $Sb_2Te_3$—$Bi_2Te_3$ (a $Sb_2Te_3$ content<a $Bi_2Te_3$ content); a material having GeTe as a main component; a material having SnTe as a main component; a material having PbTe as a main component; a material having TeAgGeSb as a main component; a material having a structure of binary skutterudite and an $MX_3$ composition (M=Co, Rh, or Ir; X=P, As, or Sb); a material having a structure of filled skutterudite and an $RT_4X_{12}$ composition (R=lanthanide element, actinide or alkaline-earth ion; T=Fe, Ru, Os, and X=P, As, or Sb); and a material having a structure of clathrate and an $A_8B_{16}E_{30}$ composition with a little doping (A=alkaline earth metal; B=III group element (Ga, Al); E=Si, Ge, or Sn).

15. The storage node of claim 13, wherein the p-type thermoelectric material is one selected from the group consisting of p-SiGe; $Sb_2Te_3$—$Bi_2Te_3$ (a $Sb_2Te_3$ content>a $Bi_2Te_3$ content); a material having GeTe as a main component; a material having SnTe as a main component; a material having PbTe as a main component; a material having TeAgGeSb as a main component; a material having a structure of binary skutterudite and an $MX_3$ composition (M=Co, Rh, or Ir; X=P, As, or Sb); a material having a structure of filled skutterudite and an $RT_4X_{12}$ composition (R=lanthanide element, actinide or alkaline-earth ion; T=Fe, Ru, Os, and X=P, As, or Sb); and a material having a structure of clathrate and an $A_8B_{16}E_{30}$ composition with a little doping (A=alkaline earth metal; B=III group element (Ga, Al); E=Si, Ge, or Sn).

16. The storage node of claim 1, wherein seeback coefficients of the lower electrode, the phase change layer, and the upper electrode are different from each other.

* * * * *